United States Patent
Wakatsuki et al.

(10) Patent No.: US 10,566,280 B2
(45) Date of Patent: Feb. 18, 2020

(54) SEMICONDUCTOR DEVICE AND METHOD OF MANUFACTURING THE SAME

(71) Applicant: TOSHIBA MEMORY CORPORATION, Minato-ku (JP)

(72) Inventors: Satoshi Wakatsuki, Yokkaichi (JP); Masayuki Kitamura, Yokkaichi (JP); Takeshi Ishizaki, Nagoya (JP); Hiroshi Itokawa, Kuwana (JP); Daisuke Ikeno, Yokkaichi (JP); Kei Watanabe, Yokkaichi (JP); Atsuko Sakata, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/103,106

(22) Filed: Aug. 14, 2018

(65) Prior Publication Data
US 2019/0279932 A1    Sep. 12, 2019

(30) Foreign Application Priority Data

Mar. 9, 2018    (JP) .................................. 2018-043090

(51) Int. Cl.
*H01L 23/522* (2006.01)
*H01L 27/1157* (2017.01)
*H01L 27/11582* (2017.01)
*H01L 21/768* (2006.01)
(Continued)

(52) U.S. Cl.
CPC .... *H01L 23/5227* (2013.01); *H01L 21/76846* (2013.01); *H01L 21/76877* (2013.01); *H01L 23/53266* (2013.01); *H01L 27/1157* (2013.01); *H01L 27/11582* (2013.01); *H01L 29/40117* (2019.08)

(58) Field of Classification Search
CPC ........... H01L 23/5227; H01L 21/28282; H01L 21/76846; H01L 21/76877; H01L 23/53266; H01L 27/1157; H01L 27/11582
See application file for complete search history.

(56) References Cited

U.S. PATENT DOCUMENTS

| | | |
|---|---|---|
| 6,156,382 A | 12/2000 | Rajagopalan et al. |
| 8,551,885 B2 | 10/2013 | Chen et al. |
| 8,946,808 B2 | 2/2015 | Lee et al. |

(Continued)

FOREIGN PATENT DOCUMENTS

| | | |
|---|---|---|
| JP | 2001-525889 | 12/2001 |
| JP | 2012-501388 | 1/2012 |

(Continued)

*Primary Examiner* — Fernando L Toledo
*Assistant Examiner* — Neil R Prasad
(74) *Attorney, Agent, or Firm* — Oblob, McClelland, Maier & Neustadt, L.L.P.

(57) ABSTRACT

In one embodiment, a semiconductor device includes a first insulator. The device further includes a metal layer that includes a first metal layer provided on a surface of the first insulator, and a second metal layer provided on a surface of the first metal layer and containing a first metallic element and oxygen or containing aluminum and nitrogen, or includes a third metal layer provided on the surface of the first insulator and containing a second metallic element, aluminum and nitrogen. The device further includes an interconnect material layer provided on a surface of the metal layer.

20 Claims, 15 Drawing Sheets

(51) Int. Cl.
*H01L 23/532* (2006.01)
*H01L 21/28* (2006.01)

(56) References Cited

U.S. PATENT DOCUMENTS

| | | | |
|---|---|---|---|
| 9,406,694 | B1 | 8/2016 | Ikeno et al. |
| 9,620,366 | B2 | 4/2017 | Nakao et al. |
| 10,170,494 | B2 * | 1/2019 | Ishizaki ............ H01L 27/11582 |
| 2011/0049646 | A1 * | 3/2011 | Lim .................. H01L 21/28556 |
| | | | 257/410 |
| 2011/0233648 | A1 | 9/2011 | Seol et al. |
| 2012/0094453 | A1 * | 4/2012 | Han .................. H01L 27/11582 |
| | | | 438/269 |
| 2013/0224965 | A1 | 8/2013 | Sasaki et al. |
| 2014/0073099 | A1 | 3/2014 | Park et al. |
| 2017/0092505 | A1 * | 3/2017 | Nakao .................. H01L 21/3065 |

FOREIGN PATENT DOCUMENTS

| | | |
|---|---|---|
| JP | 2012-146773 | 8/2012 |
| JP | 2013-165266 | 8/2013 |
| JP | 2013-182961 | 9/2013 |
| JP | 2014-057068 | 3/2014 |
| JP | 5832114 | 12/2015 |
| JP | 2016-225434 | 12/2016 |
| JP | 2017-005178 | 1/2017 |

\* cited by examiner

| | NITROGEN CONCENTRATION [atoms/cm³] | | | | |
|---|---|---|---|---|---|
| | $6.00 \times 10^{18}$ | $1.00 \times 10^{19}$ | $1.00 \times 10^{20}$ | $2.00 \times 10^{20}$ | $2.00 \times 10^{21}$ |
| W FILLING ABILITY | × | ○ | ○ | ○ | ○ |
| W RESISTIVITY | ○ | ○ | ○ | ○ | × |
FIG. 18
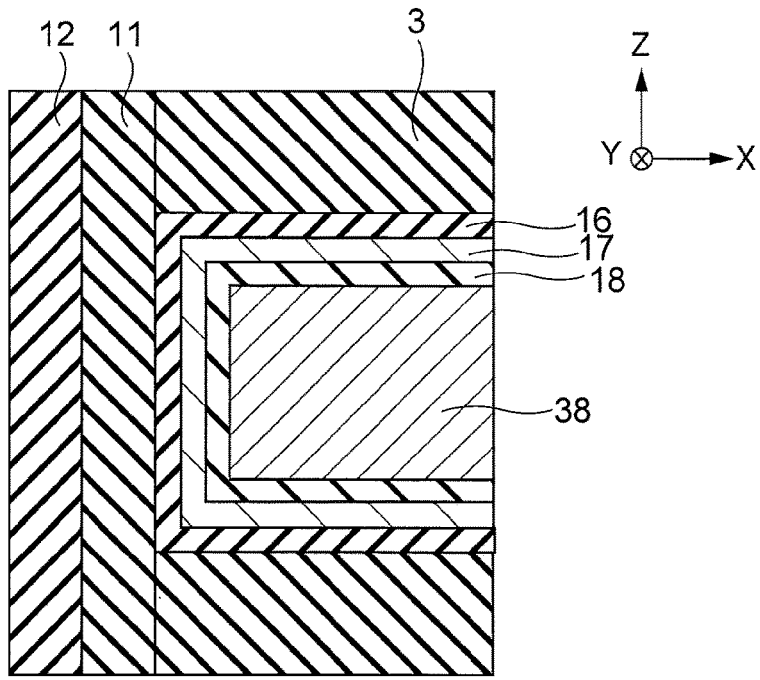
FIG. 19
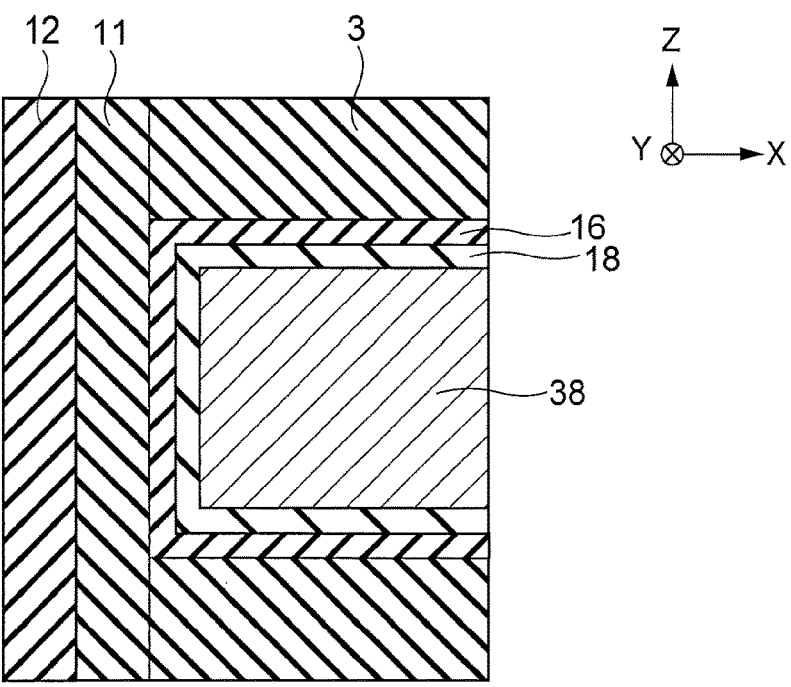
FIG. 20

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2018-043090, filed on Mar. 9, 2018, the entire contents of which are incorporated herein by reference.

FIELD

Embodiments described herein relate to a semiconductor device and a method of manufacturing the same.

BACKGROUND

In a semiconductor device, a barrier metal layer may make it difficult to form a suitable interconnect material layer. For example, when the device includes a tungsten layer as the interconnect material layer, the device often includes a titanium nitride film as a barrier metal layer for the interconnect material layer. In this case, the titanium nitride film may make it difficult to form a suitable tungsten layer.

BRIEF DESCRIPTION OF THE DRAWINGS

FIG. 18 is another graph for explaining the characteristics of the semiconductor device of the fourth embodiment;

FIG. 19 is a cross-sectional view illustrating a method of manufacturing a semiconductor device of the fifth embodiment;

FIG. 20 is a cross-sectional view illustrating a method of manufacturing a semiconductor device of the first modified example of the fifth embodiment;

DETAILED DESCRIPTION

Figure 1A:
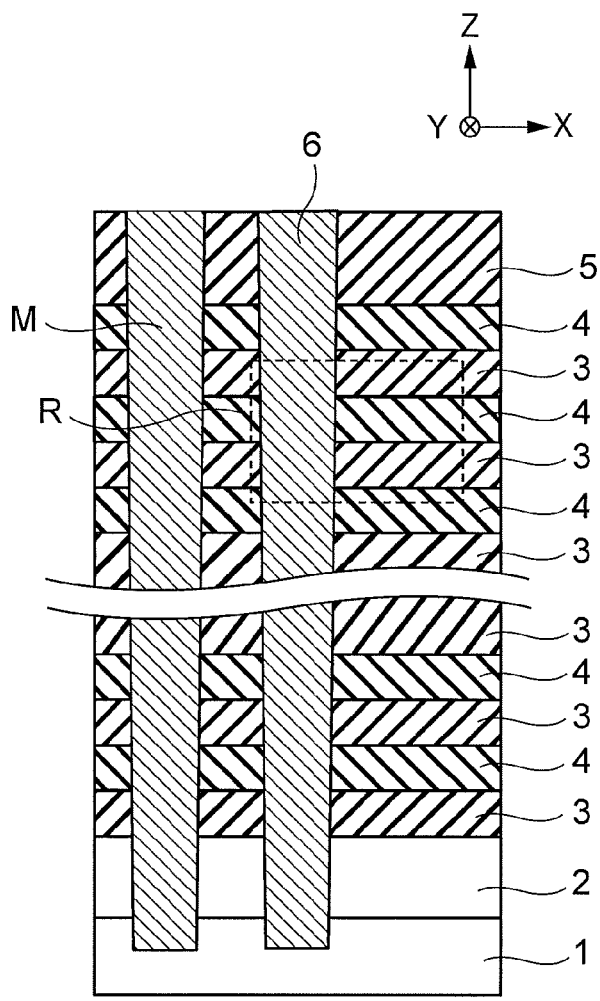
FIGS. 1A to 5B are cross-sectional views illustrating a method of manufacturing a semiconductor device of the first embodiment.

Embodiments will now be explained with reference to the accompanying drawings. In FIGS. 1A to 22, the same or similar component is denoted by the same reference numeral and redundant explanation thereof is omitted.

In one embodiment, a semiconductor device includes a first insulator. The device further includes a metal layer that includes a first metal layer provided on a surface of the first insulator, and a second metal layer provided on a surface of the first metal layer and containing a first metallic element and oxygen or containing aluminum and nitrogen, or includes a third metal layer provided on the surface of the first insulator and containing a second metallic element, aluminum and nitrogen. The device further includes an interconnect material layer provided on a surface of the metal layer.

(First Embodiment)

Figure 4A:
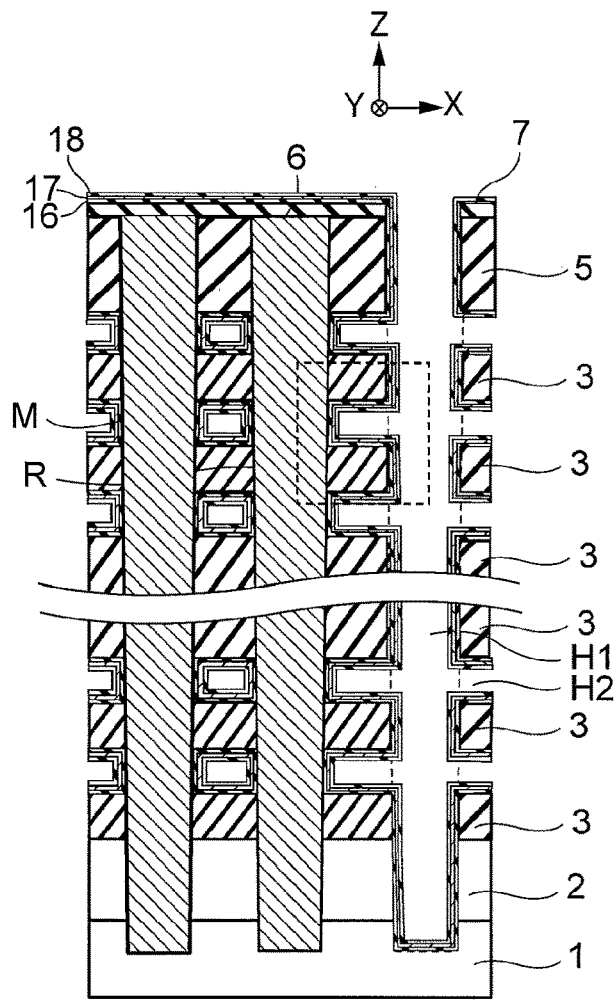
Figure 4B:
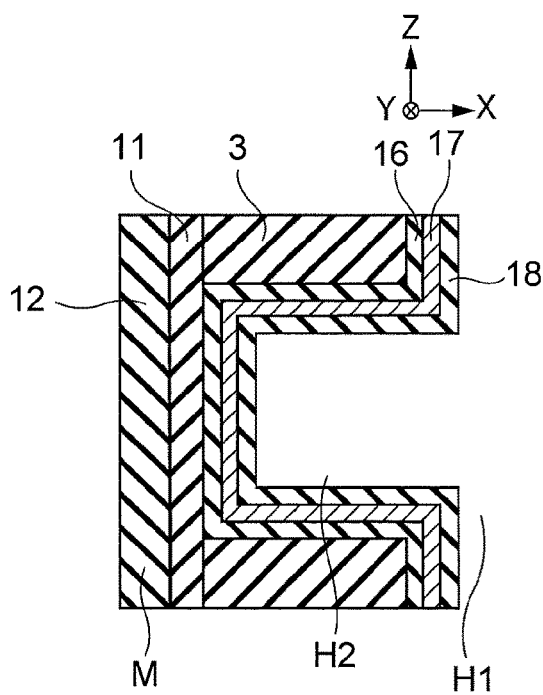
Figure 5A:
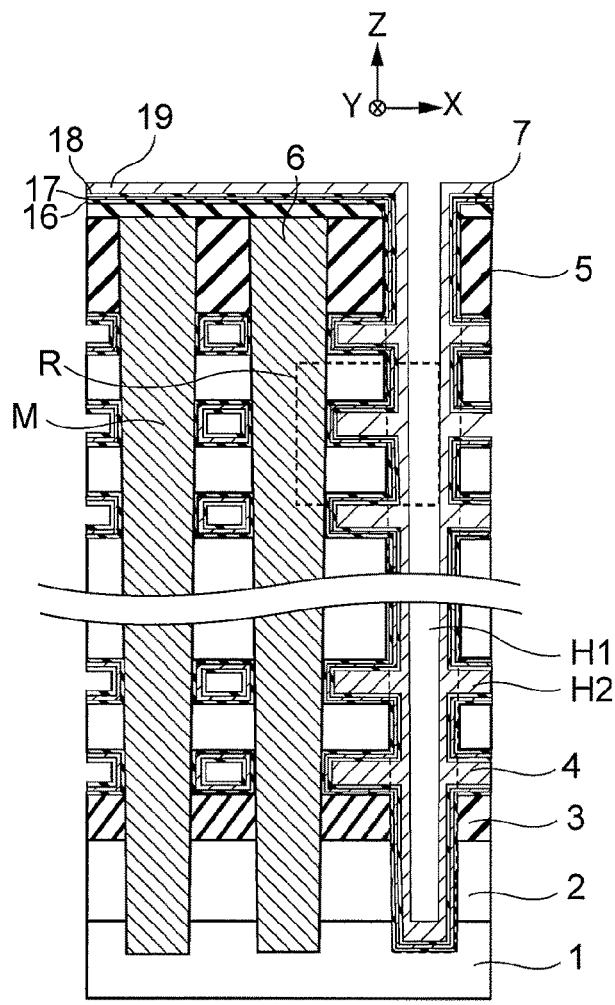
Figure 5B:
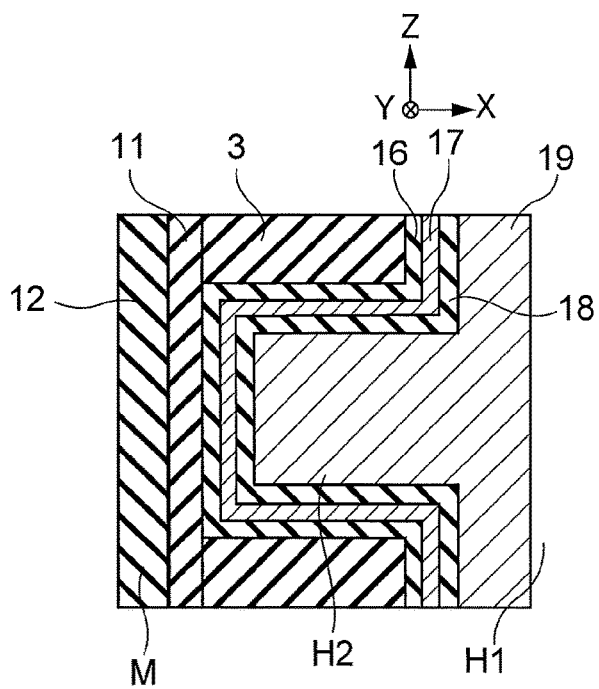

FIGS. 1A to 5B are cross-sectional views illustrating a method of manufacturing a semiconductor device of the first embodiment. FIG. 1B, FIG. 2B . . . FIG. 5B are enlarged cross-sectional views of a region R in FIG. 1A, FIG. 2A . . . FIG. 5A, respectively.

Figure 1B:
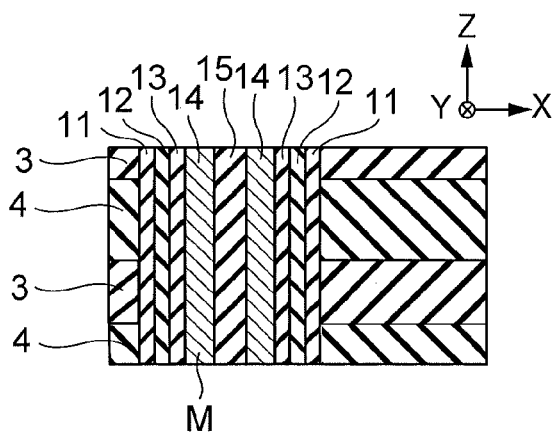

First, plural first insulating layers 3 and plural second insulating layers 4 are alternately laminated on a substrate 1 via a base layer 2 by a CVD (chemical vapor deposition) method (FIGS. 1A and 1B). The substrate 1 is, for example, a semiconductor substrate such as a single crystal Si (silicon) substrate. The base layer 2 is, for example, an inter layer dielectric such as an $SiO_2$ film (silicon oxide film) and an SiN film (silicon nitride film). Each of the first insulating layers 3 is, for example, an $SiO_2$ film with a thickness of 30 nm. Each of the second insulating layers 4 is, for example, an SiN film with a thickness of 20 nm. Both of the number of the first insulating layers 3 and the number of the second insulating layers 4 are thirty or more, for example.

FIGS. 1A and 1B indicate an X direction and a Y direction parallel to a surface of the substrate 1 and perpendicular to each other, and a Z direction perpendicular to the surface of the substrate 1. In this specification, +Z direction is treated as an upward direction and −Z direction is treated as a downward direction; however, −Z direction may or may not coincide with the gravity direction. The same applies to the other figures described later.

Then, an inter layer dielectric 5 is formed on lamination films of the first and second insulating layers 3 and 4, and a hole M penetrating the base layer 2, the plural first insulating layers 3, the plural second insulating layers 4 and the inter layer dielectric 5 is formed by lithography and an RIE (reactive ion etching) method (FIGS. 1A and 1B). Examples of the inter layer dielectric 5 include an $SiO_2$ film and an SiN film. The hole M of the present embodiment is used as a memory hole for forming a memory cell of a three-dimensional memory.

Then, a memory cell forming layer 6 is formed inside the hole M by an ALD (atomic layer deposition) method (FIGS. 1A and 1B). Specifically, a block insulator 11, a charge storage layer 12, a tunnel insulator 13, a channel semiconductor layer 14 and a core insulator 15, which are components of the memory cell forming layer 6, are successively formed on a surface of the hole M. The block insulator 11 is an example of the first insulator. The tunnel insulator 13 is an example of the second insulator.

The block insulator 11 is, for example, an $SiO_2$ film with a thickness of 5 nm. The charge storage layer 12 is, for example, an SiN film with a thickness of 7 nm. The tunnel insulator 13 is, for example, an SiON film (silicon oxynitride film) formed by nitriding an $SiO_2$ film with a thickness of 5 nm. The channel semiconductor layer 14 is, for example, a polycrystalline Si film formed by annealing an amorphous Si film containing impurities. The core insulator 15 is, for example, an $SiO_2$ film and formed so as to fill the hole M.

Figure 2A:
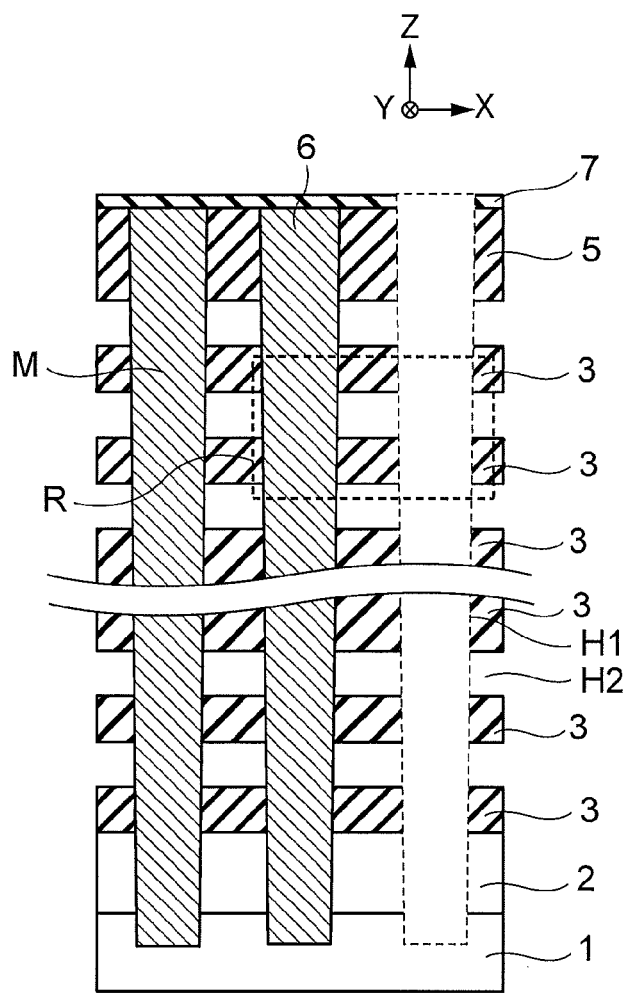
Figure 2B:
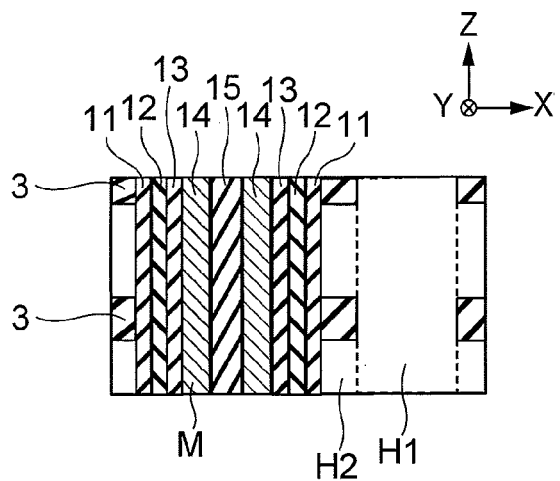

Then, a cover layer 7 is formed on the inter layer dielectric 5 and the memory cell forming layer 6, and a trench H1 penetrating the base layer 2, the plural first insulating layers 3, the plural second insulating layers 4, the inter layer dielectric 5 and the cover layer 7 is formed by the lithography and the RIE method (FIGS. 2A and 2B). Examples of the cover layer 7 include an $SiO_2$ film and an SiN film. Then, the second insulating layers 4 are removed by wet etching using the trench H1 (FIGS. 2A and 2B). As a result, plural cavities H2 are formed each between the first insulating layers 3.

Figure 3A:
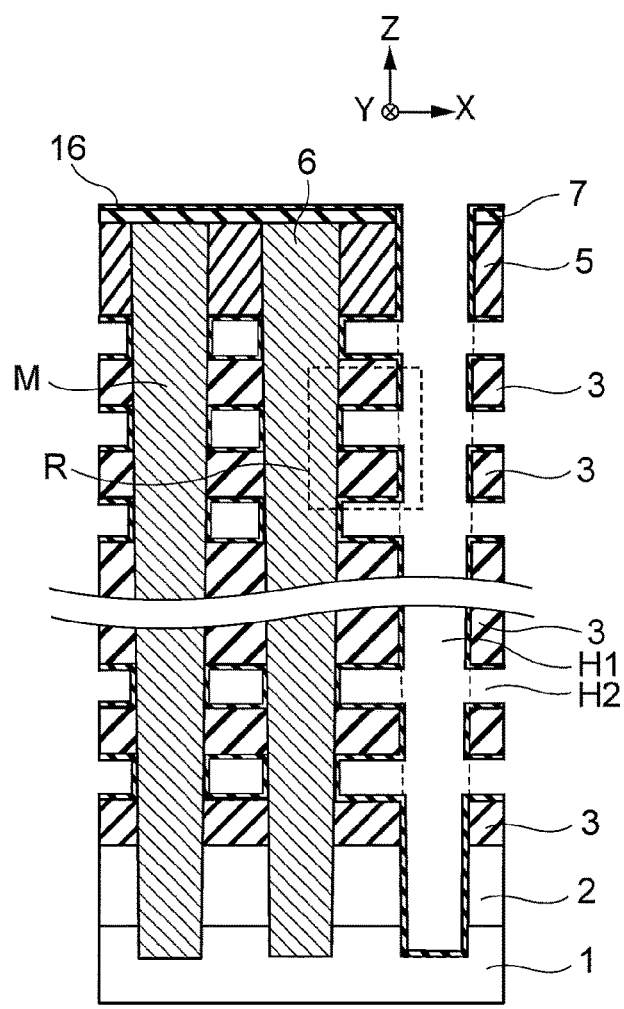
Figure 3B:
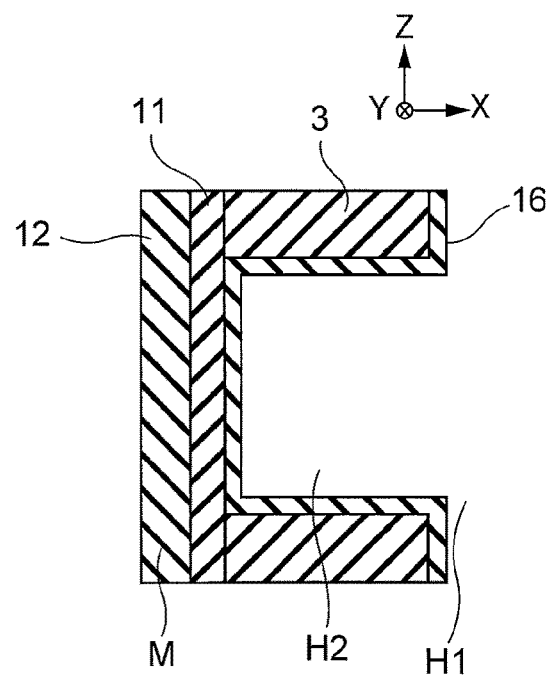

Then, a block insulator 16 is formed on an entire surface of the substrate 1 by the ALD method (FIGS. 3A and 3B). As a result, the block insulator 16 is formed on upper, lower and side faces of the first insulating layers 3 and a side face of the block insulator 11. The block insulator 16 is, for example, an $Al_2O_3$ film (aluminum oxide film) with a thickness of 3 nm. Similarly to the block insulator 11, the block insulator 16 is an example of the first insulator. In the present embodiment, the block insulator 16 then undergoes a high temperature heat treatment for improved film quality.

Then, a barrier metal layer 17 and a crystal separation layer 18 are successively formed on the entire surface of the substrate 1 by the ALD method (FIGS. 4A and 4B). As a result, the barrier metal layer 17 is formed on a surface of the block insulator 16, and the crystal separation layer 18 is formed on a surface of the barrier metal layer 17. The barrier metal layer 17 is, for example, a TiN film (titanium nitride film) with a thickness of 2 nm. The crystal separation layer 18 is, for example, a metal oxide film such as an $Al_2O_3$ film, or an AlN film (aluminum nitride film). The barrier metal layer 17 is an example of the first metal layer, and the crystal separation layer 18 is an example of the second metal layer.

Then, an interconnect material layer 19 is formed on the entire surface of the substrate 1 (FIGS. 5A and 5B). As a result, the interconnect material layer 19 is formed on a surface of the crystal separation layer 18. The interconnect material layer 19 is, for example, a W (tungsten) layer and functions as a control electrode and a word line of a three-dimensional memory.

Here, the interconnect material layer 19 will be explained in detail.

In the case where the crystal separation layer 18 is an $Al_2O_3$ film or an AlN film and the interconnect material layer 19 is a W layer, it is difficult to make $WF_6$ adsorbed by the surface of the crystal separation layer 18 in forming the interconnect material layer 19 through reaction of a $WF_6$ gas and an $H_2$ gas (F and H represent fluorine and hydrogen, respectively). Further, in the case where the stress of the interconnect material layer 19 is large, it is difficult to ensure adhesiveness between the crystal separation layer 18 and the interconnect material layer 19.

Accordingly, in the present embodiment, an $SiH_4$ gas is first supplied to the crystal separation layer 18 to make $SiH_4$ adsorbed by the surface of the crystal separation layer 18. In this case, $SiH_4$ is considered to be adsorbed by metal atoms (Al atoms here) on the surface of the crystal separation layer 18. Then, when a $WF_6$ gas is supplied to the crystal separation layer 18, $WF_6$ is adsorbed by $SiH_4$ on the surface of the crystal separation layer 18. This allows to form the interconnect material layer 19 through reaction of the $WF_6$ gas and the $H_2$ gas. The interconnect material layer 19 of this case contains fluorine. A $B_2H_6$ gas (B represents boron) may be used instead of the $SiH_4$ gas.

Additionally, to prevent reduction in adhesiveness between the crystal separation layer 18 and the interconnect material layer 19 due to the stress of the interconnect material layer 19, it is preferable to reduce the stress of the interconnect material layer 19. Accordingly, in the present embodiment, the stress of the interconnect material layer 19 is reduced by reducing a fluorine concentration in the interconnect material layer 19. For example, using the interconnect material layer 19 having a fluorine concentration of $1 \times 10^{18}$ atoms/cm$^3$ or less allows to ensure good adhesiveness.

Examples of the method of making the fluorine concentration of $1 \times 10^{18}$ atoms/cm$^3$ or less include the ALD method, which alternately supplies the $WF_6$ gas and the $H_2$ gas to form the interconnect material layer 19. Compared to the CVD method, which simultaneously supplies the $WF_6$ gas and the $H_2$ gas, this ALD method is advantageous in that the fluorine concentration can be made $1 \times 10^{18}$ atoms/cm$^3$ or less even at a deposition temperature of 500° C. or less. This allows to form the interconnect material layer 19 with reduced stress and ensure good adhesiveness while preventing fluorine from diffusing to damage and deteriorate the block insulators 16, 11 and the first insulating layers 3.

Figure 6:
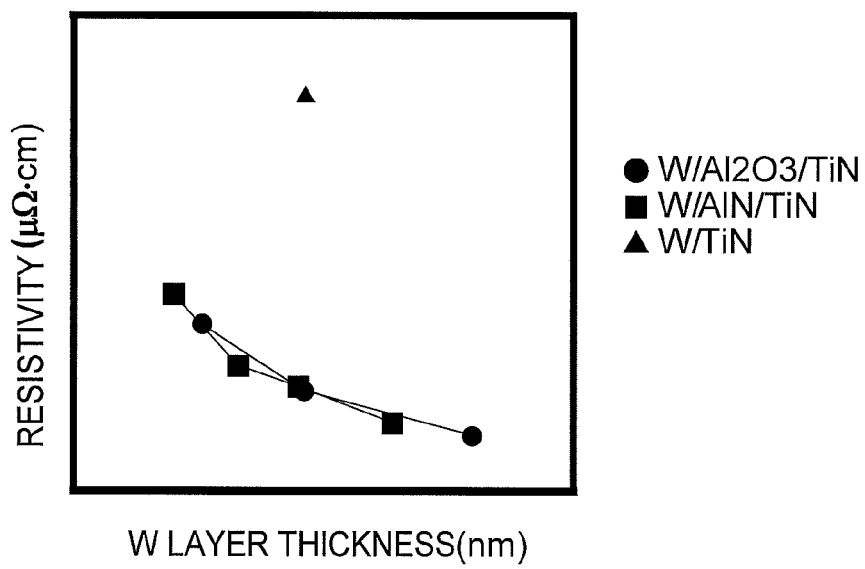
FIG. 6 is a graph for explaining characteristics of the semiconductor device of the first embodiment.

FIG. 6 is a graph for explaining characteristics of the semiconductor device of the first embodiment.

FIG. 6 shows a relationship between the thickness of the interconnect material layer (W layer) 19 and resistivity in the case where the crystal separation layer 18 is an $Al_2O_3$ film, in the case where the crystal separation layer 18 is an AlN film, and in the case where the crystal separation layer 18 is absent. The resistivity represents a value immediately after depositing the interconnect material layer 19. From FIG. 6, it can be seen that introducing the crystal separation layer 18 between the barrier metal layer 17 and the interconnect material layer 19 reduces the resistivity by 50% or more as compared to the case where the crystal separation layer 18 is not introduced.

One reason for this is considered as follows. When the barrier metal layer 17 is a TiN film, the barrier metal layer 17 is composed of columnar crystal grains with a small grain size. In this case, if the interconnect material layer 19 is directly formed on the surface of the barrier metal layer 17, crystal grains of the interconnect material layer 19 become small as affected by the crystal grains of the barrier metal layer 17. On the other hand, when the crystal separation layer 18 is introduced between the barrier metal layer 17 and the interconnect material layer 19, the crystal separation layer 18 functions to interrupt the crystal grains of the barrier metal layer 17 from affecting the crystal grains of the interconnect material layer 19. This allows to enlarge the crystal grains of the interconnect material layer 19, enabling to reduce the resistivity of the interconnect material layer 19.

Examples of the crystal separation layer 18 having this function include an amorphous film and a crystalline film having a different crystal structure than an NaCl (sodium chloride) structure, which is a crystal structure of the TiN film (barrier metal layer 17). Further, it is considered preferable that the crystal separation layer 18 is not a single metal film but a metal oxide film or a metal nitride film, which are more thermally stable than a single metal film, in order to prevent fluorine in the interconnect material layer 19 from penetrating the barrier metal layer 17 and diffusing to deteriorate the block insulators 16, 11 and the first insulating layers 3 during a subsequent heating process.

However, many of the binary metal nitrides have an NaCl structure as in TiN, such as TaN (tantalum nitride), HfN (hafnium nitride), ZrN (zirconium nitride) and NbN (niobium nitride). Accordingly, when focused on the function of interrupting the barrier metal layer 17 from affecting the interconnect material layer 19, many of the suitable materials for the crystal separation layer 18 are considered to be present in metal oxides rather than metal nitrides. Specifically, examples of this crystal separation layer 18 include, in addition to an $Al_2O_3$ film, a $TiO_2$ film (titanium oxide film), a $Ta_2O_5$ film (tantalum oxide film), an $HfO_2$ film (hafnium oxide film) and a $ZrO_2$ film (zirconium oxide film). A metallic element contained in these metal oxide films is an example of the first metallic element.

Meanwhile, an AlN film is more stable in a hexagonal crystal structure than an NaCl structure, unlike other metal nitride films. Accordingly, when the crystal separation layer 18 is an AlN film, a resistivity reduction effect is obtained as shown in FIG. 6.

With the crystal separation layer 18 of a metal oxide film or an AlN film, the resistivity of the interconnect material layer 19 can be reduced as described above. In this case, given the function of the thickness of the crystal separation layer 18 on the function of a memory cell, the thickness of the crystal separation layer 18 is preferably 2.0 nm or less. Further, to ensure that the crystal separation layer 18 effectively functions to interrupt the barrier metal layer 17 from affecting the interconnect material layer 19, the thickness of the crystal separation layer 18 is preferably 0.5 nm or more.

As described above, the semiconductor device of the present embodiment includes the crystal separation layer 18 such as a metal oxide film or an AlN film between the barrier metal layer (TiN film) 17 and the interconnect material layer (W layer) 19. This allows, for example, to eliminate a high temperature heat treatment to the interconnect material layer 19 for reducing the resistivity of the interconnect material layer 19, and to reduce the resistivity of the interconnect material layer 19 while preventing fluorine in the interconnect material layer 19 from diffusing to deteriorate the block insulators 16, 11 and the first insulating layers 3. In this way, the present embodiment allows to suitably form the interconnect material layer 19.

Although the present embodiment is applied to the barrier metal layer 17 and the interconnect material layer 19 of a three-dimensional NAND flash memory, the present embodiment may be applied to any other structure. For example, the present embodiment may be applied to a barrier metal layer and an interconnect material layer of a two-dimensional NAND flash memory. However, reduction in the resistivity of the interconnect material layer 19 is more often required for a three-dimensional NAND flash memory, and accordingly the present embodiment is preferably applied to the barrier metal layer 17 and the interconnect material layer 19 of a three-dimensional NAND flash memory. The same applies to the second to fifth embodiments described below.

(Second Embodiment)

Figure 7:
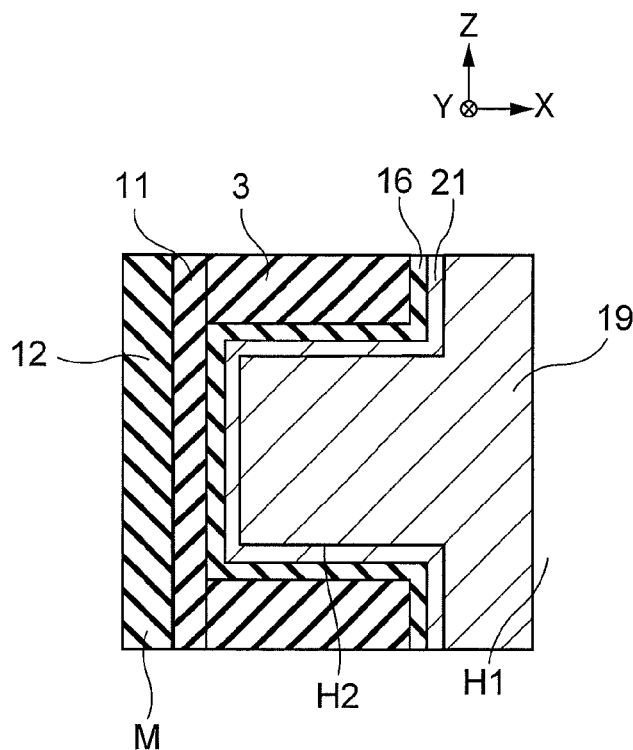
FIG. 7 is a cross-sectional view illustrating a method of manufacturing a semiconductor device of the second embodiment.

FIG. 7 is a cross-sectional view illustrating a method of manufacturing a semiconductor device of the second embodiment.

FIG. 7 is a cross-sectional view corresponding to that shown in FIG. 5B. In the present embodiment, the barrier metal layer 17 and the crystal separation layer 18 are replaced with a barrier metal layer 21. This structure can be achieved by forming the barrier metal layer 21 in the step shown in FIGS. 4A and 4B, instead of the barrier metal layer 17 and the crystal separation layer 18. The barrier metal layer 21 is, for example, a TiAlN film (titanium aluminum nitride film) with a thickness of 2 nm, and formed by the ALD method. The barrier metal layer 21 is an example of the third metal layer, and titanium is an example of the second metallic element.

To form the barrier metal layer 21 of the present embodiment, the first process of supplying a Ti-based material gas and an $NH_3$ (ammonia) gas and the second process of supplying an Al-based material gas and an $NH_3$ gas are alternately performed. Through these processes, plural TiN films and plural AlN films are alternately laminated. The thickness of each of the TiN films and the AlN films is approximately 0.03 nm for example.

At this time, by adjusting the total thickness of the TiN films with respect to the total thickness of the barrier metal layer 21 and adjusting the total thickness of the AlN films with respect to the total thickness of the barrier metal layer 21, the ratio of a Ti concentration (the number of Ti atoms) to an Al concentration (the number of Al atoms) in the barrier metal layer 21 can be controlled. The barrier metal layer 21 of the present embodiment is formed such that the ratio of the Al concentration to the total concentration of Ti and Al is 0.55 to 0.75. Let the Ti concentration be "$C_{Ti}$" and the Al concentration be "$C_{Al}$", this relationship is expressed by "$0.55 \leq C_{Al}/(C_{Al}+C_{Ti}) \leq 0.75$". Hereinafter, this ratio is referred to as the "Al concentration ratio".

Figure 8:
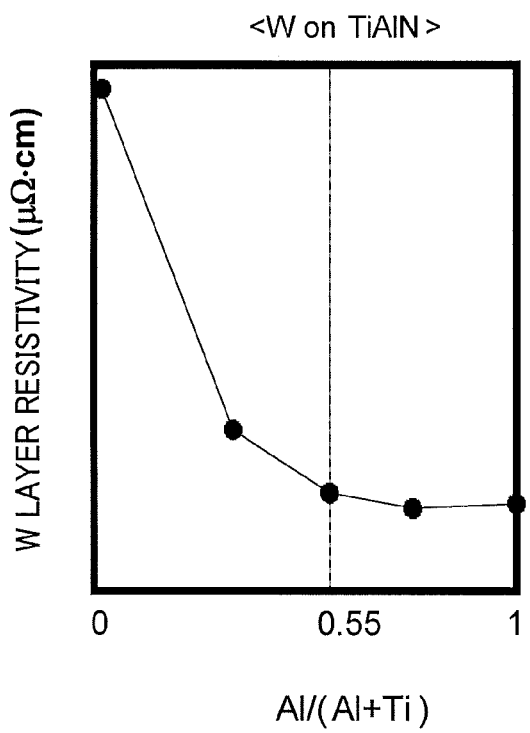
FIG. 8 is a graph for explaining characteristics of the semiconductor device of the second embodiment.

FIG. 8 is a graph for explaining characteristics of the semiconductor device of the second embodiment.

FIG. 8 shows dependency of the resistivity of the interconnect material layer 19 on the Al concentration ratio. From FIG. 8, it can be seen that the resistivity of the interconnect material layer 19 tends to decrease as the Al concentration ratio increases, and the resistivity is saturated at the Al concentration ratio of 0.55 or more. One reason for this is considered to be that, since the crystal grain size of an AlN film is larger than that of an TiN film with the same thickness, the AlN film hardly hinders grain size growth of the interconnect material layer 19. In this way, the present embodiment can reduce the resistivity of the interconnect material layer 19 by using the barrier metal layer 21 having the Al concentration ratio of 0.55 or more.

Figure 9:
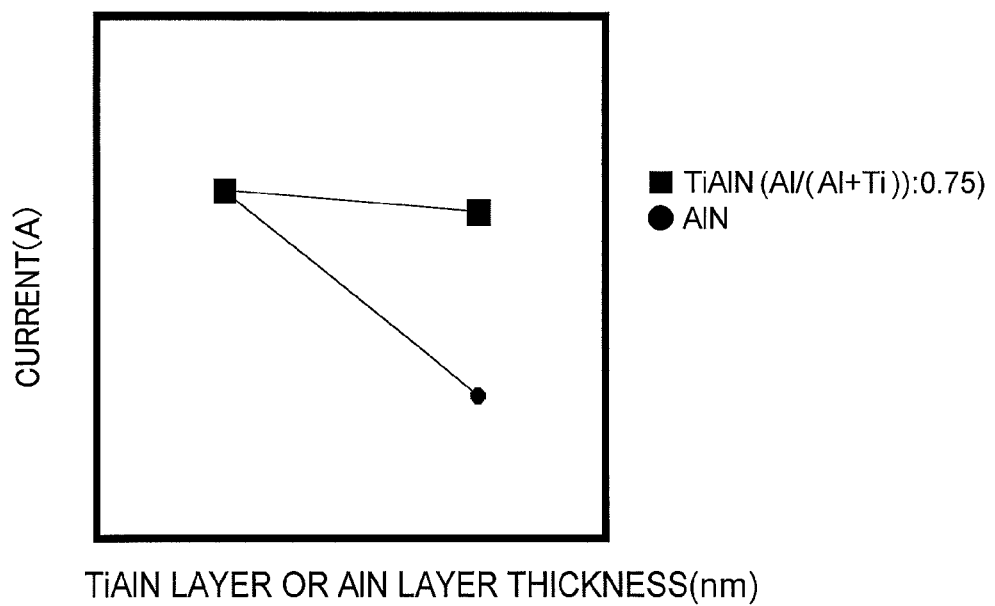
FIG. 9 is another graph for explaining characteristics of the semiconductor device of the second embodiment.

FIG. 9 is another graph for explaining characteristics of the semiconductor device of the second embodiment.

FIG. 9 shows dependency of a current value of a plane capacitor with a TiN/TiAlN/TiN structure on a TiAlN film thickness, and dependency of a current value of a plane capacitor with a TiN/AlN/TiN structure on an AlN film thickness. Note that the Al concentration ratio of the TiAlN film is 0.75. According to FIG. 9, while the latter current value decreases with the increase in the AlN film thickness, the former current value does not remarkably decrease with the increase in the TiAlN film thickness. From this, it can be seen that a TiAlN film having the Al concentration ratio of 0.75 or less can be treated as a conductor film.

Therefore, the Al concentration ratio of the barrier metal layer 21 of the present embodiment is adjusted to 0.55 to 0.75. This can prevent an unnecessary increase in thickness of an electric insulator and fully ensure a threshold variation in a memory cell, allowing to reduce the resistivity of the interconnect material layer 19 and ensure the memory cell characteristics at the same time.

Figure 10A:
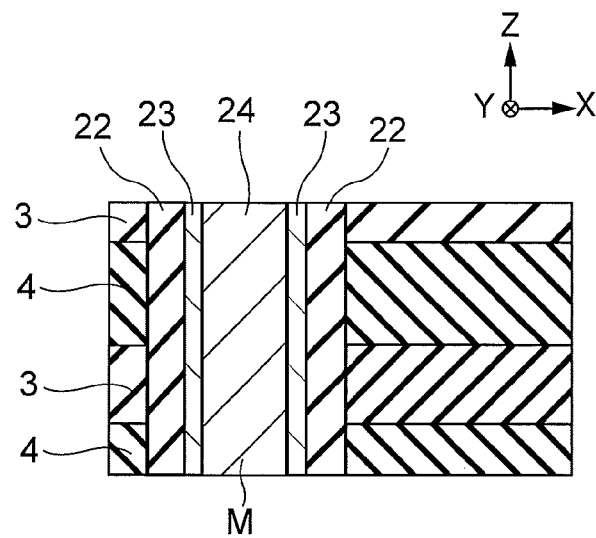
FIGS. 10A and 10B are cross-sectional views illustrating a method of manufacturing a semiconductor device of a modified example of the second embodiment.
Figure 10B:
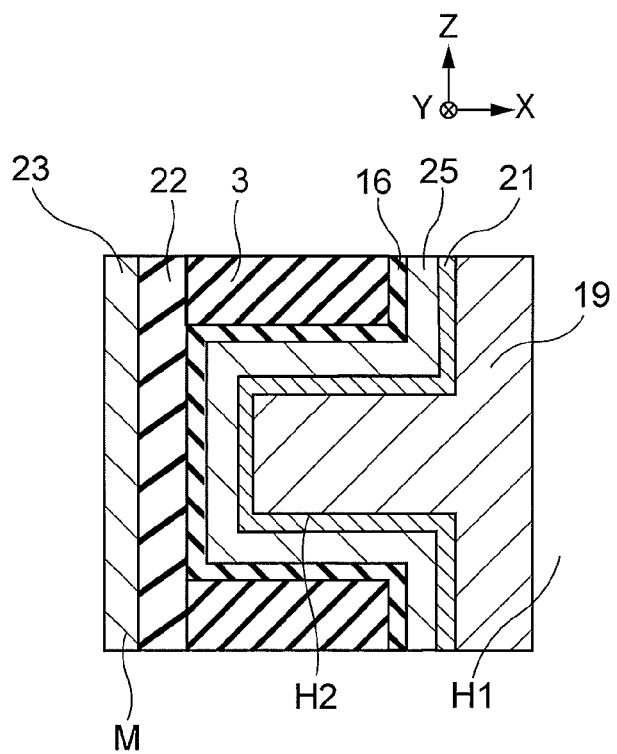

FIGS. 10A and 10B are cross-sectional views illustrating a method of manufacturing a semiconductor device of a modified example of the second embodiment.

FIG. 10A is a cross-sectional view corresponding to that shown in FIG. 1B. In the modified example, the block insulator 11, the charge storage layer 12, the tunnel insulator 13, the channel semiconductor layer 14 and the core insulator 15 inside the hole M are replaced with a first memory film 22, a second memory film 23, and a third memory film 24. This structure can be achieved by successively forming the first memory film 22, the second memory film 23 and the third memory film 24 in the step shown in FIGS. 1A and 1B, instead of the block insulator 11, the charge storage layer 12, the tunnel insulator 13, the channel semiconductor layer 14 and the core insulator 15.

The first memory film 22 is, for example, a $TiO_x$ film (titanium oxide film) with a thickness of 10 nm and formed by ALD method before undergoing a heat treatment for crystallization. The second memory film 23 is, for example, a TiN film with a thickness of 5 nm and formed by the ALD method. The third memory film 24 is, for example, a W layer and formed by the CVD method. The second and third memory films 23 and 24 each function as a bit line.

FIG. 10B is a cross-sectional view corresponding to that shown in FIG. 5B. In the modified example, the barrier metal layer 17 and the crystal separation layer 18 are replaced with a semiconductor layer 25 and the barrier metal layer 21. This structure can be achieved by forming the semiconductor layer 25 and the barrier metal layer 21 in the step shown in FIGS. 4A and 4B, instead of the barrier metal layer 17 and the crystal separation layer 18.

The semiconductor layer 25 is, for example, an amorphous Si layer with a thickness of 5 nm, and formed on the surface of the block insulator 16 ($Al_2O_3$ film) with a thickness of 0.5 nm by the CVD method. The barrier metal layer 21 is, for example, a TiAlN film as described above and formed by the ALD method. The Al concentration ratio of the barrier metal layer 21 of the modified example is adjusted to 0.55 to 0.75.

As described above, the semiconductor device of the present embodiment includes the barrier metal layer 21 such as a TiAlN film instead of the barrier metal layer 17 and the crystal separation layer 18. This allows to suitably form the interconnect material layer 19, as in the first embodiment.

The present embodiment further allows to reduce the resistivity of the interconnect material layer 19 and ensure the memory cell characteristics at the same time by adjusting the Al concentration ratio of the barrier metal layer 21 to 0.55 to 0.75.

Ti in the barrier metal layer 21 may be replaced with any other metallic element functioning as in Ti. Examples of such a metallic element include Ta (tantalum), Hf (hafnium), Zr (zirconium), V (vanadium) and Nb (niobium).

(Third Embodiment)

Figure 11:
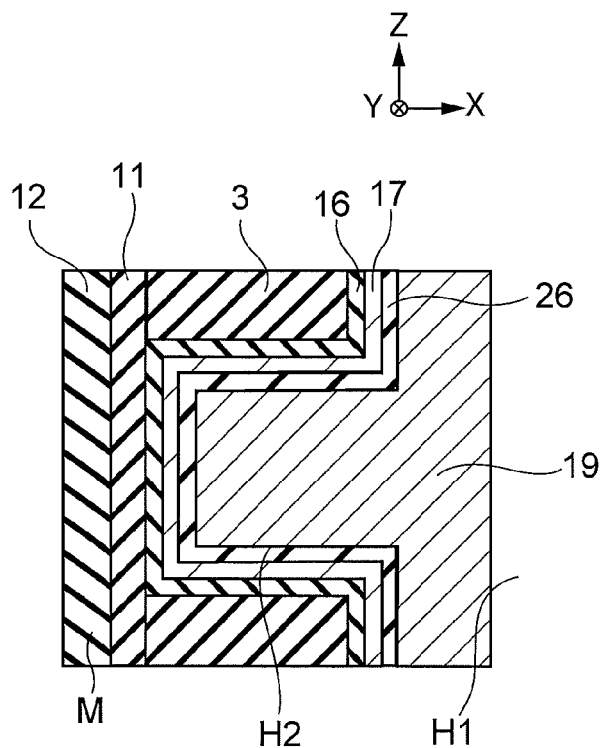
FIG. 11 is a cross-sectional view illustrating a method of manufacturing a semiconductor device of the third embodiment.

FIG. 11 is a cross-sectional view illustrating a method of manufacturing a semiconductor device of the third embodiment.

FIG. 11 is a cross-sectional view corresponding to that shown in FIG. 5B. In the present embodiment, the crystal separation layer 18 is replaced with a liner layer 26. This structure can be achieved by forming the liner layer 26 in the step shown in FIGS. 4A and 4B, instead of the crystal separation layer 18. The liner layer 26 is, for example, an AlN film with a thickness of 1 nm and formed on the surface of the barrier metal layer 17 (TiN film) with a thickness of 2 nm by the ALD method. The barrier metal layer 17 is an example of the first metal layer, and the liner layer 26 is an example of the second metal layer.

Specifically, the liner layer 26 of the present embodiment is an AlN film added with Si (silicon). This allows to prevent fluorine in the interconnect material layer 19 from diffusing to the block insulators 16, 11 and the first insulating layers 3. Any other group IV semiconductor element than Si may be added to this AlN film. Examples of such a group IV semiconductor element include Ge (germanium).

Figure 12:
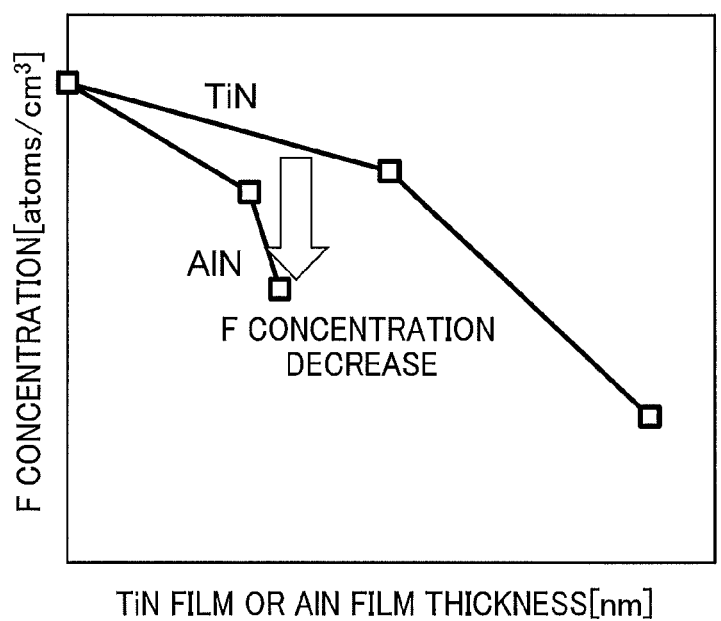
FIG. 12 is a graph for explaining characteristics of the semiconductor device of the third embodiment.

FIG. 12 is a graph for explaining characteristics of the semiconductor device of the third embodiment.

FIG. 12 shows a fluorine concentration in the block insulator 11 and the first insulating layers 3 in the case where the barrier metal layer 17 (TiN film) alone is provided between the block insulator 16 and the interconnect material layer 19 and in the case where the liner layer 26 (AlN film) alone is provided between the block insulator 16 and the interconnect material layer 19. The horizontal axis in FIG. 12 represents the thickness of the TiN film and the AlN film. From FIG. 12, it can be seen that the AlN film more effectively prevents diffusion of fluorine than the TiN film.

As described above, the semiconductor device of the present embodiment includes an Si-containing AlN film as the liner layer 26 between the barrier metal layer (TiN film) 17 and the interconnect material layer (W layer) 19. Therefore, the present embodiment can prevent fluorine in the interconnect material layer 19 from diffusing to the block insulators 16, 11 and the first insulating layers 3 and reduce the resistivity of the interconnect material layer 19 at the same time, achieving improvement of functionality and reliability of a memory cell.

(Fourth Embodiment)

FIGS. 13A to 14C are cross-sectional views illustrating a method of manufacturing a semiconductor device of the fourth embodiment.

Figure 13A:
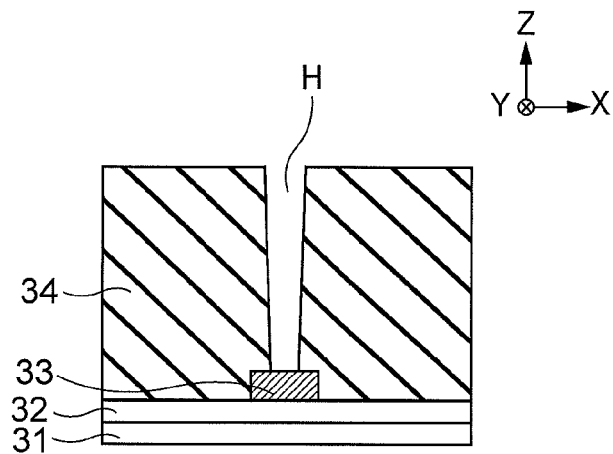
FIGS. 13A to 14C are cross-sectional views illustrating a method of manufacturing a semiconductor device of the fourth embodiment.

First, an isolation film and a transistor (not shown) are formed on a substrate 31 and thereafter a base layer 32 is formed on the substrate 31 (FIG. 13A). The substrate 31 is, for example, a semiconductor substrate such as an Si substrate. The base layer 32 is, for example, an inter layer dielectric such as an $SiO_2$ film and an SiN film. Similarly to FIG. 1A, FIG. 13A indicates an X direction and a Y direction parallel to a surface of the substrate 31 and perpendicular to each other, and a Z direction perpendicular to the surface of the substrate 31. The same applies to the other figures described later.

Then, a metal interconnect 33 is formed on the base layer 32, and an inter layer dielectric 34 is formed on the base layer 32 and the metal interconnect 33 (FIG. 13A). The metal interconnect 33 is, for example, an Al interconnect, a W interconnect, or a Cu (copper) interconnect. The inter layer dielectric 34 is an example of the first insulator. Then, a via hole H penetrating the inter layer dielectric 34 to reach the metal interconnect 33 is formed by lithography and etching (FIG. 13A).

Figure 13B:
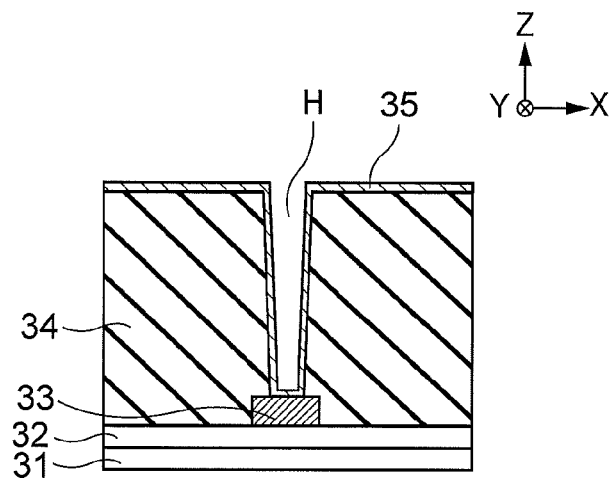

Then, an adhesion layer 35 is formed on an entire surface of the substrate 31 by the CVD method (FIG. 13B). As a result, the adhesion layer 35 is formed on surfaces of the inter layer dielectric 34 and the metal interconnect 33 inside the via hole H. The adhesion layer 35 is, for example, a TiN film with a thickness of 2 nm. The adhesion layer 35 is an example of the first metal layer.

Figure 13C:
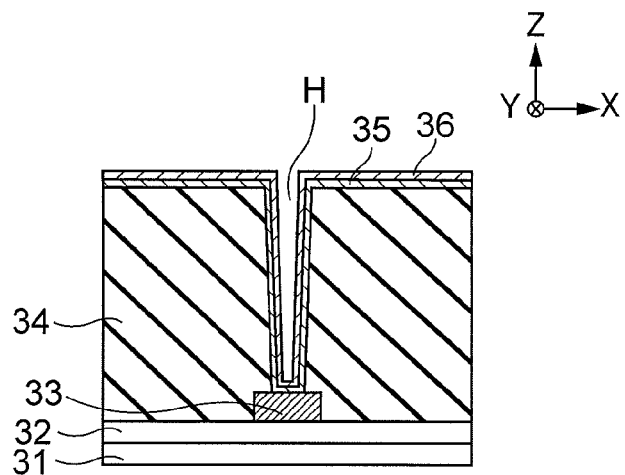

Then, a liner layer 36 is formed on the entire surface of the substrate 31 (FIG. 13C). As a result, the liner layer 36 is formed on a surface of the adhesion layer 35 inside the via hole H. The liner layer 36 is, for example, an $AlO_x$ film (aluminum oxide film) with a thickness of 1 nm and formed by $O_3$ oxidation using a TMA (trimethylaluminum) gas. The liner layer 36 may be any other metal oxide film than the $AlO_x$ film. The liner layer 36 is an example of the second metal layer.

Figure 14A:
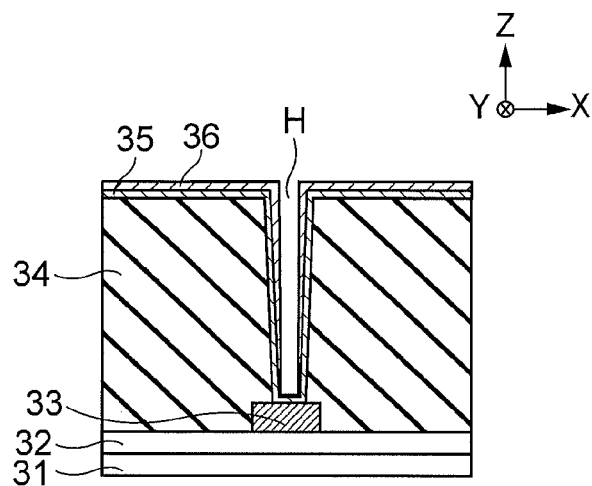

As shown in FIG. 14A, the liner layer 36 may be absent on a bottom surface of the via hole H (an upper face of the metal interconnect 33) by adjusting the coverage of the liner layer 36. This allows to reduce a contact resistance in the bottom surface of the via hole H.

Figure 14B:
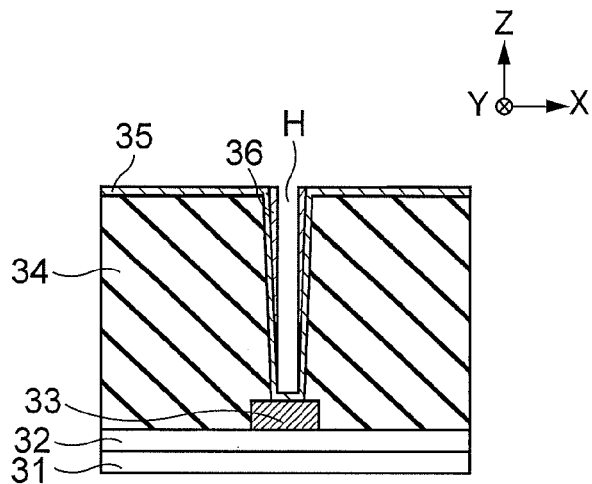

Meanwhile, in the case shown in FIG. 13C, the liner layer 36 on the outside of the via hole H and on an upper face thereof may be removed by reverse sputtering (FIG. 14B). This allows to reduce a contact resistance in the bottom surface of the via hole H.

Figure 14C:
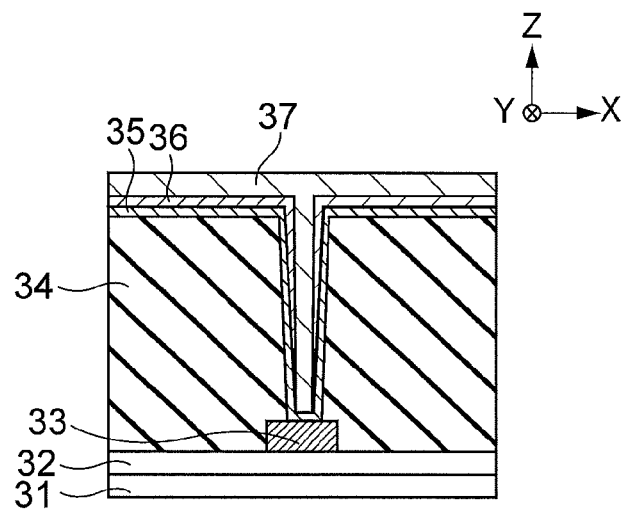

After the step shown in FIG. 13C, FIG. 14A or FIG. 14B, an interconnect material layer 37 is formed on the entire surface of the substrate 31 (FIG. 14C). As a result, the interconnect material layer 37 is embedded inside the via hole H. The interconnect material layer 37 is, for example, a W (tungsten) layer. Since the interconnect material layer 37 of the present embodiment is formed on the surface of the adhesion layer 35 via the liner layer 36, the interconnect material layer 37 is in contact with the surface of the liner layer 36. Further, the interconnect material layer 37 of the present embodiment contains nitrogen as described later, and a nitrogen concentration in the interconnect material layer 37 is preferably adjusted to $1\times10^{19}$ to $2\times10^{20}$ atoms/cm³.

Hereinafter, the interconnect material layer 37 will be described in detail still with reference to FIG. 14C. In the explanation, FIGS. 15-18 will be referenced as necessary. FIGS. 15-18 are graphs and a cross-sectional view for explaining characteristics of the semiconductor device of the fourth embodiment.

Figure 15A:
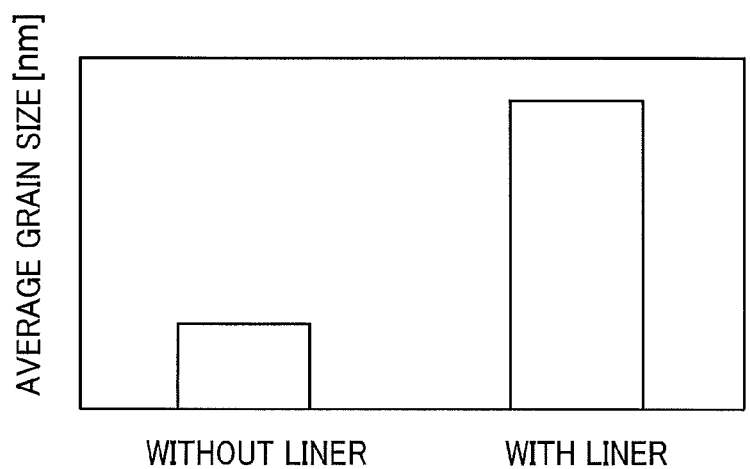
FIGS. 15A and 15B are graphs for explaining characteristics of the semiconductor device of the fourth embodiment.
Figure 15B:
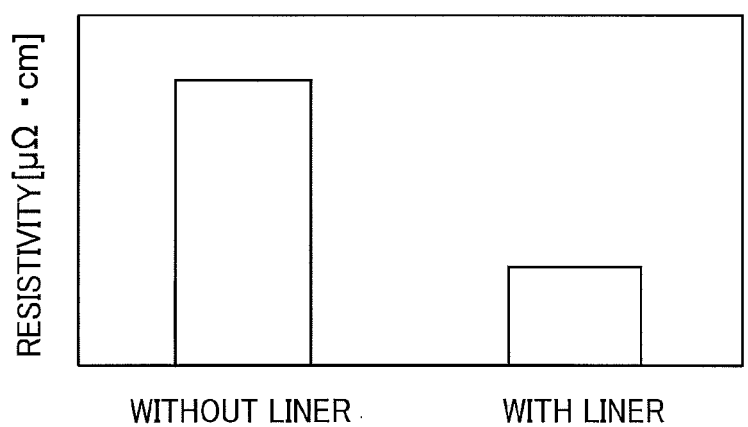

As explained in the first embodiment, when the interconnect material layer 37 is formed on a surface of a metal oxide film (the liner layer 36), the size of crystal grains in the interconnect material layer 37 becomes large, leading to the reduced resistivity of the interconnect material layer 37. This can be seen in the graphs of FIGS. 15A and 15B. FIG. 15A shows that when the liner layer 36 is used, an average size of crystal grains in the interconnect material layer 37 becomes large as compared to the case where the liner layer 36 is not used. FIG. 15B shows that when the liner layer 36 is used, the resistivity of the interconnect material layer 37 is reduced as compared to the case where the liner layer 36 is not used.

In the embodiment, the interconnect material layer 37 is formed on the surface of the liner layer 36 by the ALD method (or the CVD method). For example, an $SiH_4$ gas is supplied at 400° C. to the substrate 31 to make $SiH_4$ adsorbed by the surface of the liner layer 36. Then, a $WF_6$ gas and an $H_2$ gas are alternately supplied to the substrate 31. As a result, the interconnect material layer 37 is formed on the surface of the liner layer 36.

Figure 16:
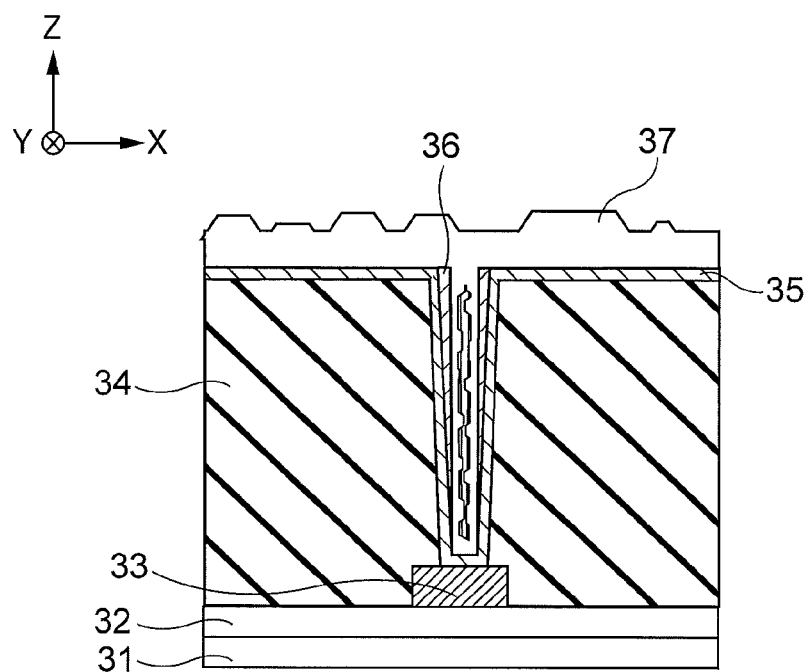
FIG. 16 is a cross-sectional view for explaining the characteristics of the semiconductor device of the fourth embodiment.

In the present embodiment, an $N_2$ gas may be simultaneously supplied to the substrate 31 when supplying the $WF_6$ gas and when supplying the $H_2$ gas. This can reduce roughness of the surface of the interconnect material layer 37. Without the supply of the $N_2$ gas, the size of crystal grains in the interconnect material layer 37 may become excessively large so as to increase the roughness of the surface of the interconnect material layer 37, and the entrance of the via hole H may be closed by the interconnect material layer 37 (FIG. 16). This may result in an embedding failure of the via hole H.

Figure 17:
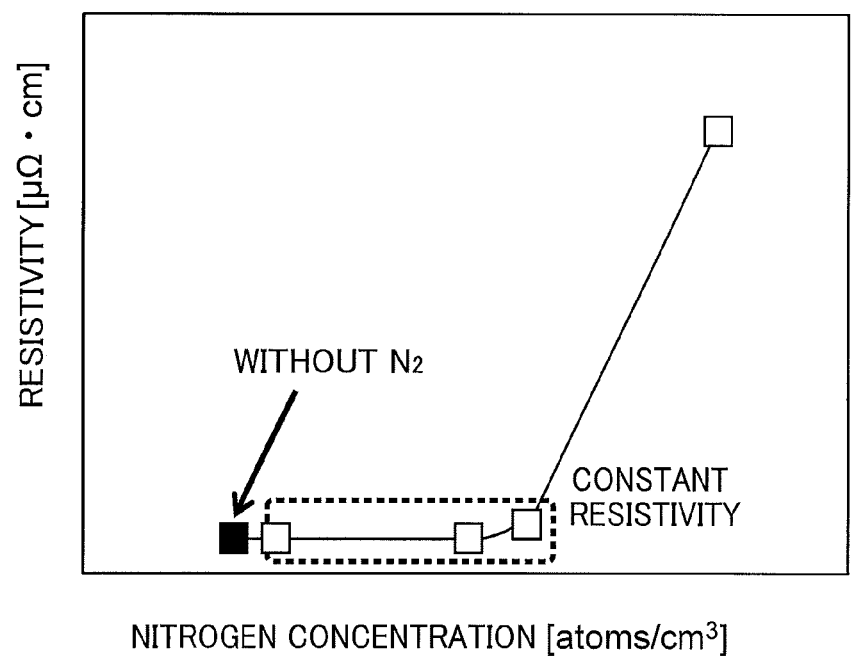
FIG. 17 is another graph for explaining the characteristics of the semiconductor device of the fourth embodiment.

When the $N_2$ gas is supplied during formation of the interconnect material layer 37, nitrogen is taken into the interconnect material layer 37. In this case, a nitrogen concentration in the interconnect material layer 37 is preferably adjusted to $1\times10^{19}$ to $2\times10^{20}$ atoms/cm³. This can keep the resistivity of the interconnect material layer 37 low and reduce the roughness of the surface of the interconnect material layer 37 (FIG. 17 and FIG. 18). The nitrogen concentration in the interconnect material layer 37 can be adjusted by, for example, controlling a flow rate and a supply time of the $N_2$ gas.

FIG. 17 shows a relationship between the nitrogen concentration and the resistivity of the interconnect material layer 37. FIG. 17 shows resistivity values for five concentrations of nitrogen. From FIG. 17, it can be seen that the resistivity starts to increase around the fourth point from the left. The nitrogen concentration at the fourth point from the left is $2\times10^{20}$ atoms/cm³. Accordingly, the nitrogen concentration is preferably adjusted to $2\times10^{20}$ atoms/cm³ or less.

FIG. 18 shows whether the filling ability of the interconnect material layer 37 is good or not and whether the resistivity of the interconnect material layer 37 is good or not, regarding the five concentrations of nitrogen. In FIG. 18, the circle means "good" and the X means "not good". According to FIG. 18, the nitrogen concentration is preferably adjusted to $1\times10^{19}$ atoms/cm³ or more in terms of filling ability. Meanwhile, the nitrogen concentration is preferably adjusted to $2\times10^{20}$ atoms/cm³ or less in terms of the resistivity, as explained in FIG. 17.

Accordingly, in the present embodiment, the nitrogen concentration in the interconnect material layer 37 is adjusted to $1\times10^{19}$ to $2\times10^{20}$ atoms/cm³. This can improve both of the filling ability and the resistivity of the interconnect material layer 37.

The interconnect material layer 37 of the present embodiment is a layer for forming a via plug; however, the results shown in FIG. 17 and FIG. 18 may be applied to an interconnect material layer for forming any other interconnect (e.g. a word line). For example, a nitrogen concentration in an interconnect material layer 38 of the fifth embodiment described later is preferably adjusted to $1\times10^{19}$ to $2\times10^{20}$ atoms/cm³.

As described above, as in the first embodiment, the semiconductor device of the present embodiment includes an $AlO_x$ film as the liner layer 36 between the adhesion layer (TiN film) 35 and the interconnect material layer (W layer) 37. Further, the interconnect material layer 37 contains nitrogen. Accordingly, the present embodiment allows to improve both of the filling ability and the resistivity of the interconnect material layer 37.

In the present embodiment, the step of forming the adhesion layer 35 (TiN film) may be omitted to directly form the liner layer 36 on the surfaces of the inter layer dielectric 34 and the metal interconnect 33. This allows to increase a volume of the interconnect material layer 37 inside the via hole H and to reduce resistivity of a via plug formed inside the via hole H. The structure without the TiN film will also be explained in the fifth embodiment described later.

(Fifth Embodiment)

FIG. 19 is a cross-sectional view illustrating a method of manufacturing a semiconductor device of the fifth embodiment.

FIG. 19 is a cross-sectional view corresponding to that shown in FIG. 5B. In the present embodiment, the interconnect material layer 19 is replaced with the interconnect material layer 38. This structure can be achieved by forming the interconnect material layer 38 in the step shown in FIGS.

5A and 5B, instead of the interconnect material layer 19. Similarly to the interconnect material layer 37 of the fourth embodiment, the interconnect material layer 38 is, for example, a W (tungsten) layer containing nitrogen at a nitrogen concentration of $1 \times 10^{19}$ to $2 \times 10^{20}$ atoms/cm$^3$. The interconnect material layer 38 can be formed by a method similar to that for forming the interconnect material layer 37 of the fourth embodiment, for example. Since the interconnect material layer 38 of the present embodiment is formed on the surface of the barrier metal layer 17 via the crystal separation layer 18, the interconnect material layer 38 is in contact with the surface of the crystal separation layer 18.

FIG. 20 is a cross-sectional view illustrating a method of manufacturing a semiconductor device of the first modified example of the fifth embodiment.

In the present modified example, the step of forming the barrier metal layer 17 (TiN film) in FIG. 19 is omitted to directly form the crystal separation layer 18 on the surface of the block insulator 16. This allows to increase a volume of the interconnect material layer 38 inside the cavity H2 (see FIG. 5B) and to reduce the resistance of an interconnect (electrode) formed inside the cavity H2.

Figure 21:
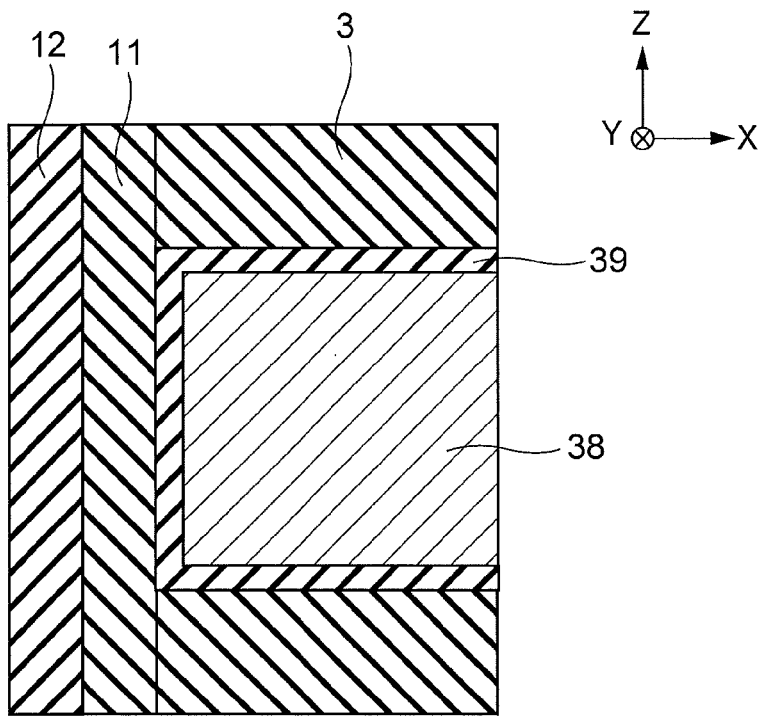
FIG. 21 is a cross-sectional view illustrating a method of manufacturing a semiconductor device of the second modified example of the fifth embodiment.

FIG. 21 is a cross-sectional view illustrating a method of manufacturing a semiconductor device of the second modified example of the fifth embodiment.

In the modified example, the block insulator 16 and the crystal separation layer 18 of FIG. 20 are replaced with a block insulator 39. The block insulator 39 is, for example, an aluminum oxide film (Al$_2$O$_3$ film). In the case where both of the block insulator 16 and the crystal separation layer 18 are an aluminum oxide film, it is easier to form the block insulator 39 than to form the block insulator 16 and the crystal separation layer 18. The block insulator 39 can be formed by a method similar to that for forming the block insulator 16 and the crystal separation layer 18, for example.

Here, the interconnect material layers of the first to fifth embodiments will be explained. Examples of these interconnect material layers are the interconnect material layer 19 of the first to third embodiments, the interconnect material layer 37 of the fourth embodiment, and the interconnect material layer 38 of the fifth embodiment. Each of the interconnect material layers of the first to fifth embodiments contains fluorine as they are formed using a fluorine-based gas (e.g. WF$_6$). The interconnect material layer may be formed using a chlorine-based gas instead of the fluorine-based gas, and may contain chlorine as a result. In this case, a chlorine concentration in the interconnect material layer is preferably adjusted to $1 \times 10^{18}$ atoms/cm$^3$ or less for the same reasons as for the fluorine concentration.

Further, each of the interconnect material layers of the first to fifth embodiments may contain both of fluorine and chlorine. One example of such an interconnect material layer will be explained with reference to FIG. 22.

Figure 22:
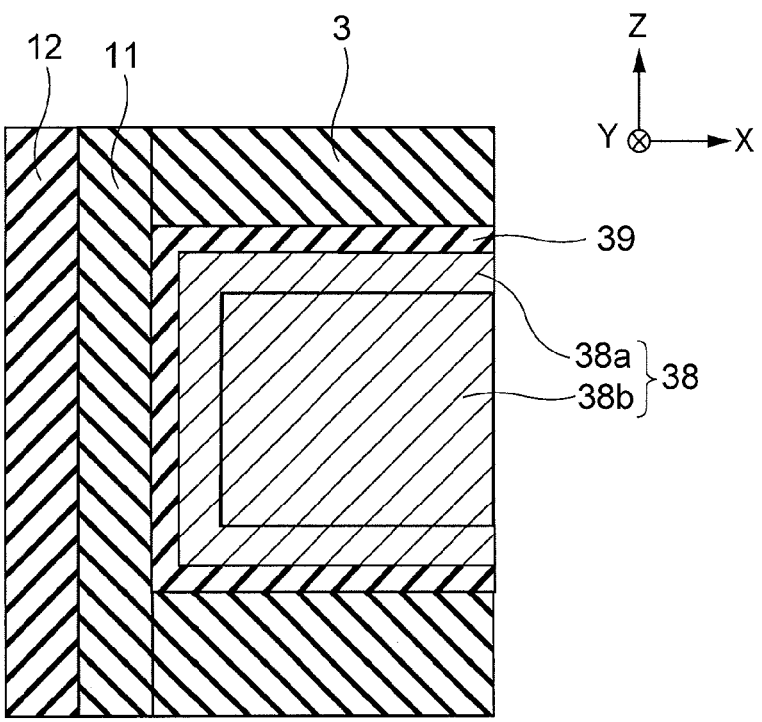
FIG. 22 is a cross-sectional view illustrating a method of manufacturing a semiconductor device of the third modified example of the fifth embodiment.

FIG. 22 is a cross-sectional view illustrating a method of manufacturing a semiconductor device of the third modified example of the fifth embodiment.

The interconnect material layer 38 of FIG. 22 is a W (tungsten) layer containing nitrogen at a nitrogen concentration of $1 \times 10^{19}$ to $2 \times 10^{20}$ atoms/cm$^3$ as in the interconnect material layer 38 of FIG. 21, and includes a first interconnect material layer 38a and a second interconnect material layer 38b.

Because the first interconnect material layer 38a is formed on a surface of the block insulator 39 using a chlorine-based gas, the first interconnect material layer 38a is a W layer containing nitrogen and chlorine. A chlorine concentration in the first interconnect material layer 38a is preferably adjusted to $1 \times 10^{18}$ atoms/cm$^3$ or less.

Because the second interconnect material layer 38b is formed on a surface of the first interconnect material layer 38a using a fluorine-based gas, the second interconnect material layer 38b is a W layer containing nitrogen and fluorine. A fluorine concentration in the second interconnect material layer 38b is preferably adjusted to $1 \times 10^{18}$ atoms/cm$^3$ or less.

Hereinafter, details of this interconnect material layer 38 will be explained.

Forming the interconnect material layer 38 using a WF$_6$ gas involves a problem of damaging layers of the semiconductor device by fluorine. Since the semiconductor device of the present modified example does not have the barrier metal layer 17, this problem is considered likely to occur.

Accordingly, in the present modified example, the first interconnect material layer 38a is formed without using a fluorine-based gas. Specifically, the first interconnect material layer 38a is formed using a chlorine-based gas instead of a fluorine-based gas. This allows to prevent fluorine from damaging layers of the semiconductor device.

However, forming a W layer using a chlorine-based gas generally requires a higher gas cost than forming a W layer using a fluorine-based gas. Accordingly, in the present modified example, an outer portion of the interconnect material layer 38 is formed of the first interconnect material layer 38a and an inner portion of the interconnect material layer 38 is formed of the second interconnect material layer 38b. This allows to form the outer portion, which is close to the block insulator 11 and the first insulating layers 3, without using a fluorine-based gas, preventing fluorine from damaging the block insulator 11 and the first insulating layers 3. Additionally, the inner portion, which is distant from the block insulator 11 and the first insulating layers 3, is formed using a fluorine-based gas, thereby allowing to reduce the gas cost. In this way, the present modified example allows to prevent damage by fluorine and reduce the gas cost at the same time.

This configuration in which the interconnect material layer 38 is formed of the first and second interconnect material layers 38a and 38b may be applied to the interconnect material layer 19 of the first to third embodiments, the interconnect material layer 37 of the fourth embodiment and the interconnect material layer 38 of the fifth embodiment other than that shown in FIG. 22.

As described above, as in the fourth embodiment, the semiconductor device of the present embodiment includes the interconnect material layer 38 containing nitrogen. Accordingly, the present embodiment allows to improve both of the filling ability and the resistivity of the interconnect material layer 38.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first insulator;

a metal layer that includes a first metal layer provided on a surface of the first insulator, and a second metal layer provided on a surface of the first metal layer and containing a first metallic element and oxygen or containing aluminum and nitrogen, or includes a third metal layer provided on the surface of the first insulator and containing a second metallic element, aluminum and nitrogen;

an interconnect material layer provided on a surface of the metal layer;

a charge storage layer provided on a surface of the metal layer via the first insulator, the charge storage layer being different from the metal layer; and a semiconductor layer provided on a surface of the charge storage layer via a second insulator.

2. The device of claim 1, wherein the second metal layer is an aluminum oxide film, a titanium oxide film, a tantalum oxide film, a hafnium oxide film, a zirconium oxide film or an aluminum nitride film.

3. The device of claim 1, wherein the first metal layer contains titanium and nitrogen.

4. The device of claim 1, wherein the first insulator contains aluminum and oxygen.

5. The device of claim 1, wherein the second metallic element is titanium, tantalum, hafnium, zirconium, vanadium or niobium.

6. The device of claim 1, wherein a ratio of concentration of aluminum to a total concentration of the second metallic element and aluminum in the third metal layer is 0.55 to 0.75.

7. The device of claim 1, wherein the second metal layer further contains a semiconductor element.

8. The device of claim 1, wherein the interconnect material layer further contains nitrogen.

9. The device of claim 8, wherein a nitrogen concentration in the interconnect material layer is $1\times10^{19}$ to $2\times10^{20}$ atoms/cm$^3$.

10. The device of claim 1, wherein the interconnect material layer further contains fluorine and/or chlorine.

11. The device of claim 10, wherein a fluorine concentration and/or a chlorine concentration in the interconnect material layer is $1\times10^{18}$ atoms/cm$^3$ or less.

12. The device of claim 10, wherein the interconnect material layer includes a first interconnect material layer that contains chlorine, and a second interconnect material layer that contains fluorine.

13. The semiconductor device comprising:
a first insulator;
a metal layer provided on a surface of the first insulator and containing aluminum and oxygen or containing aluminum and nitrogen;
an interconnect material layer in contact with a surface of the metal layer and containing nitrogen;
a charge storage layer provided on a surface of the metal layer via the first insulator, the charge storage layer being different from the metal layer; and
a semiconductor layer provided on a surface of the charge storage layer via a second insulator.

14. The device of claim 13, wherein the interconnect material layer further contains fluorine and/or chlorine.

15. The device of claim 14, wherein the interconnect material layer includes a first interconnect material layer that contains nitrogen and chlorine, and a second interconnect material layer that contains nitrogen and fluorine.

16. A method of manufacturing a semiconductor device, comprising:
forming a first insulator;
successively forming a charge storage layer, a second insulator, and a semiconductor layer on a surface of the first insulator;
forming a metal layer that includes a first metal layer provided on a surface of the first insulator, and a second metal layer provided on a surface of the first metal layer and containing a first metallic element and oxygen or containing aluminum and nitrogen, or includes a third metal layer provided on the surface of the first insulator and containing a second metallic element, aluminum and nitrogen, the metal layer being different from the charge storage layer; and
forming an interconnect material layer on a surface of the metal layer.

17. The method of claim 16, wherein the second metal layer is an aluminum oxide film, a titanium oxide film, a tantalum oxide film, a hafnium oxide film, a zirconium oxide film or an aluminum nitride film.

18. The method of claim 16, wherein the interconnect material layer further contains nitrogen.

19. The method of claim 16, wherein the interconnect material layer further contains fluorine and/or chlorine.

20. A semiconductor device comprising:
an interconnect;
a first insulator provided on a surface of the interconnect;
a metal layer that includes a first metal layer provided on a surfaces of the interconnect and the first insulator, and a second metal layer provided on a surface of the first metal layer and containing a first metallic element and oxygen or containing aluminum and nitrogen, or includes a third metal layer provided on the surfaces of the interconnect and the first insulator and containing a second metallic element, aluminum and nitrogen, the metal layer being different from the interconnect and electrically connected to the interconnect; and
an interconnect material layer provided on a surface of the metal layer.

* * * * *